(12) United States Patent
Lindahl et al.

(10) Patent No.: US 9,987,687 B2
(45) Date of Patent: Jun. 5, 2018

(54) CVD COATED CUTTING TOOL

(71) Applicant: SANDVIK INTELLECTUAL PROPERTY AB, Sandviken (SE)

(72) Inventors: Erik Lindahl, Sandviken (SE); Jan Engqvist, Sandviken (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 61 days.

(21) Appl. No.: 14/975,626

(22) Filed: Dec. 18, 2015

(65) Prior Publication Data

US 2016/0175940 A1   Jun. 23, 2016

(30) Foreign Application Priority Data

Dec. 19, 2014   (EP) .................................... 14199190

(51) Int. Cl.
| | | |
|---|---|---|
| *B23B 27/14* | (2006.01) | |
| *C23C 16/02* | (2006.01) | |
| *C23C 16/40* | (2006.01) | |
| *C23C 28/04* | (2006.01) | |

(52) U.S. Cl.
CPC ........ *B23B 27/148* (2013.01); *C23C 16/0272* (2013.01); *C23C 16/403* (2013.01); *C23C 28/042* (2013.01); *C23C 28/044* (2013.01); *C23C 28/048* (2013.01); *B23B 2222/28* (2013.01); *B23B 2224/04* (2013.01); *B23B 2224/32* (2013.01); *B23B 2224/36* (2013.01); *B23B 2226/18* (2013.01); *B23B 2228/04* (2013.01); *B23B 2228/105* (2013.01)

(58) Field of Classification Search
USPC .......... 51/307, 309; 428/216, 336, 698, 701, 428/702
See application file for complete search history.

(56) References Cited

U.S. PATENT DOCUMENTS

| | | | | |
|---|---|---|---|---|
| 5,861,210 A | * | 1/1999 | Lenander | ............... C23C 16/403 428/698 |
| 2008/0057280 A1 | * | 3/2008 | Watanabe | ............... C23C 16/36 428/216 |
| 2010/0330360 A1 | * | 12/2010 | Tanibuchi | ........... C23C 16/0272 428/332 |
| 2012/0015148 A1 | | 1/2012 | Sakari | |
| 2014/0173996 A1 | | 6/2014 | Stiens et al. | |
| 2014/0193624 A1 | | 10/2014 | Stiens et al. | |

FOREIGN PATENT DOCUMENTS

| | | | |
|---|---|---|---|
| EP | 2 604 720 | * | 6/2013 |
| JP | 11-131235 | * | 5/1999 |
| WO | 2014198881 A1 | | 12/2014 |

* cited by examiner

*Primary Examiner* — Archene Turner
(74) *Attorney, Agent, or Firm* — Corinne R. Gorski

(57) ABSTRACT

A coated cutting tool for chip forming machining of metals includes a substrate having a surface coated with a chemical vapour deposition (CVD) coating. The coating has a layer of $\alpha$-$Al_2O_3$, wherein the $\alpha$-$Al_2O_3$ layer exhibits a texture coefficient TC(0 0 12)≥7.2 and wherein the ratio of I(0 0 12)/I(0 1 14) is ≥1.

8 Claims, No Drawings

CVD COATED CUTTING TOOL

RELATED APPLICATION DATA

This application claims priority under 35 U.S.C. § 119 to EP Patent Application No. 14199190.1, filed on Dec. 19, 2014, which the entirety thereof is incorporated herein by reference.

TECHNICAL FIELD

The present disclosure relates to a coated cutting tool for chip forming machining of metals including a substrate having a surface coated with a chemical vapour deposition (CVD) coating. The coated cutting tool in accordance with the present disclosure is particularly useful in applications with high demands of abrasive wear resistance in for example turning, milling or drilling of a metallic material such as alloyed steel, carbon steel or tough hardened steel.

BACKGROUND

Chemical Vapour Deposition (CVD) of wear resistant coatings on cemented carbide cutting tools has been in industrial practice for many years. Coatings such as TiCN and $Al_2O_3$ have shown to improve the wear resistance on cutting inserts in cutting of many different materials. A combination on an inner layer of TiCN and an outer layer of $\alpha$-$Al_2O_3$ can be found on many commercial cutting inserts designed for turning of, for example, steel.

EP1905870A2 discloses a coated cutting insert comprising a coating with at least one $\alpha$-$Al_2O_3$ layer showing a strong growth texture along <0 0 1>. The edge toughness of the insert was improved in turning.

SUMMARY

It is an aspect of the present disclosure to provide an alumina coated cutting tool insert with improved performance in cutting operations. It is a further aspect of the disclosure to provide a coated cutting tool with improved wear resistance, for example a higher resistance to crater wear and an enhanced resistance to flank wear of the cutting edge. Another aspect of the disclosure is to provide a cutting tool with high performance in turning of steel, such as alloyed steels, carbon steels and tough hardened steels.

DETAILED DESCRIPTION

The cutting tool in accordance with the present disclosure includes a substrate coated with a coating having a layer of $\alpha$-$Al_2O_3$, wherein the $\alpha$-$Al_2O_3$ exhibits a texture coefficient TC(hkl), as measured by X-ray diffraction using CuK$\alpha$ radiation and $\theta$-$2\theta$ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1} \quad (1)$$

where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12)

characterized in that

TC(0 0 12)≥7.2; ≥7.4; ≥7.5; ≥7.6; ≥7.7; and ≤8 and wherein the ratio of I(0 0 12)/I(0 1 14)≥1; ≥1.5; ≥1.7; ≥2, wherein I(0 0 12) is the measured intensity (integrated area) of the 0 0 12 reflection and I(0 1 14) is the measured intensity (integrated area) of the 0 1 14 reflection.

An $\alpha$-$Al_2O_3$ layer with such a high TC(0 0 12) in combination with a I(0 0 12) equal or larger than I(0 1 14) has shown to be advantageous as a layer on cutting tools due to its unexpectedly high crater and flank wear resistance.

The $\alpha$-$Al_2O_3$ layer is typically deposited with thermal CVD. Alternatively, other CVD deposition processes can be used. This is also the case for any further layers of the coating as disclosed below. HTCVD is herein defined as a CVD process within the temperature range 950-1050° C., and MTCVD within 800-950° C.

The $\alpha$-$Al_2O_3$ layer covers at least the area of the cutting tool that is engaged in cutting in a cutting operation, and at least the areas exposed for crater wear and/or flank wear. Alternatively the whole cutting tool can be coated with the $\alpha$-$Al_2O_3$ layer and/or with any further layers of the coating.

A strong <0 0 1> texture is herein means a statistically preferred growth along the <0 0 1> crystallographic direction, i.e. the $\alpha$-$Al_2O_3$ grains grow with their (0 0 1) crystallographic plane parallel to the substrate surface more frequently than with other crystallographic planes parallel to the substrate surface. A means to express preferred growth along a <h k l> crystallographic direction is the texture coefficient TC (h k l) calculated using the Harris formula (formula (1) above) on the basis of a defined set of XRD reflections measured on the respective sample. The intensities of the XRD reflections are standardized using a JCPDF-card indicating the intensities of the XRD reflections of the same material, e. g. $\alpha$-$Al_2O_3$, but with random orientation, such as in a powder of the material. A texture coefficient TC (h k l)>1 of a layer of crystalline material is an indication that the grains of the crystalline material are oriented with their (h k l) crystallographic plane parallel to the substrate surface more frequently than in a random distribution, at least compared to the XRD reflections used in the Harris formula to determine the texture coefficient TC. The texture coefficient TC (0 0 12) is used herein to indicate preferred crystal growth along the <0 0 1> crystallographic direction. The (0 0 1) crystallographic plane is parallel to the (0 0 6) and (0 0 12) crystallographic planes in the $\alpha$-$Al_2O_3$ crystallographic system.

In one embodiment of the present disclosure the thickness of the $\alpha$-$Al_2O_3$ layer is 2-20 µm, preferably 2-10 µm, or 3-7 µm.

In one embodiment of the present disclosure the coating further includes an MTCVD TiCN layer located between the substrate and the $\alpha$-$Al_2O_3$ layer. The grains of the MTCVD TiCN layer are columnar. In one embodiment, the thickness of the MTCVD TiCN layer is 4-20 µm, preferably 4-15 µm, most preferably 5-12 µm. By MTCVD TiCN is herein meant a $Ti(C_x,N_{1-x})$ wherein 0.2≤x≤0.8, preferably 0.3≤x≤0.7, more preferably 0.4≤x≤0.6. The C/(C+N) ratio of the TiCN can for example be measured with an electron micro probe analysis.

In one embodiment of the present disclosure the coating further comprises a bonding layer comprising a HTCVD deposited TiN, TiCN, TiCNO and/or TiCO or a combination thereof, preferably HTCVD TiCN and TiCNO, located outermost of the MTCVD TiCN layer and adjacent to the $\alpha$-$Al_2O_3$ layer. The bonding layer is to enhance the adhesion between the MTCVD TiCN layer and the $\alpha$-$Al_2O_3$ layer. The bonding layer is preferably oxidized prior to the α-Al$_2$O$_3$ layer deposition. The bonding layer comprises non-columnar grains, for example equally axed grains. The thickness of the bonding layer is preferably 0.5-2 µm, most preferably 1-2 µm.

In one embodiment, the TiCN layer, located between the α-Al$_2$O$_3$ layer and the substrate, exhibits a texture coefficient TC(hkl), as measured by X-ray diffraction using CuKα radiation and θ-2θ scan, defined according to Harris formula (1) where I(hkl) is the measured intensity (integrated area) of the (hkl) reflection, I$_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1), wherein TC(2 2 0) is ≤0.5; ≤0.3; ≤0.2; or ≤0.1. A low intensity from the (2 2 0) has shown to be advantageous in that it seems to promote a strong <0 0 1> texture of the subsequent α-Al$_2$O$_3$ layer. One way of achieving a low TC(220) is to adjust the volume ratio of TiCl$_4$/CH$_3$CN in an initial part, preferably at the start, of the MTCVD TiCN deposition to a relatively high level.

In one embodiment, the TiCN layer exhibits a TC(4 2 2)≥3 or ≥3.5. In one embodiment, the TiCN layer exhibits a TC(3 1 1)+TC(4 2 2)≥4; ≥5; ≥6; or ≥7. These TC values are calculated using the Harris formula (1), the ICDD's PDF-card no 42-1489 and the reflections (1 1 1), (2 0 0), (2 2 0), (3 1 1), (3 3 1), (4 2 0), (4 2 2) and (5 1 1).

In one embodiment, the substrate is cemented carbide, cermet or ceramic. These substrates have hardnesses and toughnesses that suit the coating of the present disclosure.

In one embodiment, the substrate of the coated cutting tool consists of cemented carbide includes 4-12 wt % Co, preferably 6-8 wt % Co, optionally 0.1-10 wt % cubic carbides, nitrides or carbonitrides of metals from groups IVb, Vb and VIb of the periodic table, preferably Ti, Nb, Ta or combinations thereof, and balance WC.

In one embodiment, the substrate is cemented carbide with a binder phase enriched surface zone. The thickness of the binder phase enriched surface zone is preferably 5-35 µm as measured from the surface of the substrate and towards the core of the substrate. The binder phase enriched zone has in average a binder phase content at least 50% higher than the binder phase content in the core of the substrate. A binder phase enriched surface zone enhances the toughness of the substrate. A substrate with a high toughness is preferred in cutting operations such as turning of steel.

In one embodiment, the substrate is cemented carbide with a surface zone essentially free from cubic carbides. The thickness of the surface zone essentially free from cubic carbides is preferably 5-35 µm as measured from the surface of the substrate and towards the core of the substrate. By "essentially free" means that no cubic carbides is visible in an ocular analyse of a cross section in a light optical microscope.

In one embodiment, the substrate is a cemented carbide with a binder phase enriched surface zone, as disclosed above. in combination with a surface zone essentially free from cubic carbides as disclosed above.

In one embodiment, the α-Al$_2$O$_3$ layer is the outermost layer of the coating. Alternatively, one or more further layers can cover the α-Al$_2$O$_3$ layer, such as layers of TiN, TiC, Al$_2$O$_3$ and/or combinations thereof. In one embodiment of the present disclosure the one or more further layers covering the α-Al$_2$O$_3$ layer is/are removed from the flank face or the rake face or the cutting edge or combinations thereof.

In one embodiment, the coating is post treated by blasting or brushing to release tensile stresses of the CVD coated layers and to reduce the surface roughness.

The present disclosure also relates to the use of a coated cutting tool as disclosed herein in a turning operation of steel, preferably of alloyed steel, carbon steel or tough hardened steel. The cutting tools have shown specifically enhanced performance in crater and flank wear demanding operations.

Methods

CVD Coating Deposition

The CVD coatings in the examples below were deposited in a radial Ion bond type CVD equipment 530 size capable of housing 10000 half-inch size cutting inserts.

X-Ray Diffraction Measurement

In order to investigate the texture of the layer(s) X-ray diffraction was conducted on the flank face using a PANalytical CubiX3 diffractometer equipped with a PIXcel detector. The coated cutting tools were mounted in sample holders to ensure that the flank face of the samples are parallel to the reference surface of the sample holder and also that the flank face is at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu-K$_{α2}$ stripping and profile fitting of the data, was done using PANalytical's X'Pert HighScore Plus software. The output (integrated peak areas for the profile fitted curve) from this program were then used to calculate the texture coefficients of the layer by comparing the ratio of the measured intensity data to the standard intensity data according to a PDF-card of the specific layer (such as a layer of TiCN or α-Al$_2$O$_3$), using the Harris formula (1) as disclosed above. Since the layer was a finitely thick film the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-Al$_2$O$_3$ layer will affect the X-ray intensities entering the α-Al$_2$O$_3$ layer and exiting the whole coating, corrections need to be made for these as well, taken into account the linear absorption coefficient for the respective compound in a layer. The same applies for X-ray diffraction measurements of a TiCN layer if the TiCN layer is located below for example an α-Al$_2$O$_3$ layer. Alternatively, a further layer, such as TiN, above an alumina layer can be removed by a method that does not substantially influence the XRD measurement results, e.g. chemical etching.

In order to investigate the texture of the α-Al$_2$O$_3$ layer X-ray diffraction was conducted using CuK$_α$ radiation and texture coefficients TC (hkl) for different growth directions of the columnar grains of the α-Al$_2$O$_3$ layer were calculated according to Harris formula (1) as disclosed above, where I(hkl)=measured (integrated area) intensity of the (hkl) reflection, I$_0$(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12). In the calculation of the ratio I(0 0 12)/I(0 1 14) the integrated peak area intensity of the (0 0 12) peak and the (0 1 14) peak were divided, independently of any PDF-card.

The measured integrated peak area is thin film corrected and corrected for any further layers above (i.e. on top of) the α-$Al_2O_3$ layer before the ratio is calculated.

The texture coefficients TC (hkl) for different growth directions of the columnar grains of the TiCN layer were calculated according to Harris formula (1) as disclosed earlier, where I(hkl) is the measured (integrated area) intensity of the (hkl) reflection, $I_0$(hkl) is the standard intensity according to ICDD's PDF-card no 42-1489, n is the number of reflections to be used in the calculation. In this case the (hkl) reflections used are (1 1 1), (2 0 0), (2 2 0), (3 1 1), (3 3 1), (4 2 0), (4 2 2) and (5 1 1).

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the α-$Al_2O_3$ layer with peaks from the TiCN layer might influence measurement and needs to be considered. It is also to be noted that for example WC in the substrate can have diffraction peaks close to the relevant peaks of the present disclosure.

EXAMPLES

Exemplifying embodiments of the present disclosure will now be disclosed in more detail and compared to reference embodiments. Coated cutting tools (inserts) were manufactured, analysed and evaluated in a cutting test.

Example 1

Invention

Cemented carbide substrates of ISO-type CNMG120408 for turning (samples E13C-1, E13C-2, E29C-1, E29C-2, E30C-1, E30C-2, E35C-1 and E35C-2) were manufactured from 7.2 wt-% Co, 2.7 wt % Ta, 1.8 wt % Ti, 0.4 wt % Nb, 0.1 wt % N and balance WC, comprising a Co enriched surface zone of about 25 μm from the substrate surface and to a depth into the body being essentially free from cubic carbides. The composition of the cemented carbide is thus about 7.2 wt % Co, 2.9 wt % TaC, 1.9 wt % TiC, 0.4 wt % TiN, 0.4 wt % NbC and 86.9 wt % WC. Also cemented carbide substrates of ISO-type SNMA120408 (samples E13S, E29S, E30S and E35S) were manufactured with the corresponding composition and surface zone.

The inserts were first coated with a thin approximately 0.4 μm TiN-layer then with an approximately 7 μm TiCN layer by employing the well-known MTCVD technique using $TiCl_4$, $CH_3CN$, $N_2$, HCl and $H_2$ at 885° C. The volume ratio of $TiCl_4$/$CH_3CN$ in an initial part of the MTCVD deposition of the TiCN layer was 6.6, followed by a period using a ratio of $TiCl_4$/$CH_3CN$ of 3.7. The details of the TiN and the TiCN deposition are shown in Table 1.

TABLE 1

(MTCVD of TiN and TiCN)

| MT CVD of TiN and TiCN (885° C.): | Pressure [mbar] | $H_2$ [vol %] | $N_2$ [vol %] | HCl [vol %] | $TiCl_4$ [vol %] | $CH_3CN$ [vol %] |
|---|---|---|---|---|---|---|
| TiN | 400 | 48.8 | 48.8 | — | 2.44 | — |
| TiCN inner | 55 | 59 | 37.6 | — | 2.95 | 0.45 |
| TiCN outer | 55 | 81.5 | 7.8 | 7.8 | 2.38 | 0.65 |

On top of the MTCVD TiCN layer a 1-2 μm thick bonding layer was deposited at 1000° C. by a process consisting of four separate reaction steps. First, a HTCVD TiCN step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiCNO-3) using $TiCl_4$, CO, $N_2$ and $H_2$ at 70 mbar. During the third and fourth deposition steps some of the gases were continuously changed as indicated by a first start level and a second stop level presented in Table 2. Prior to the start of the subsequent $Al_2O_3$ nucleation, the bonding layer was oxidized for 4 minutes in a mixture of $CO_2$, CO, $N_2$ and $H_2$. The details of the bonding layer deposition are shown in Table 2.

TABLE 2

(Bonding layer deposition)

| Bonding layer (1000° C.): | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
|---|---|---|---|---|---|---|---|---|---|
| HTCVD TiCN | 400 | 67.9 | 25.5 | 3.4 | 1.7 | — | 1.56 | — | — |
| TiCNO-1 | 70 | 83.7 | 12 | — | 1.2 | 1.2 | 1.5 | 0.4 | — |
| TiCNO-2 | 70 | 63.1-61.7 | 31.5-30.9 | — | — | 1.6-3.7 | 3.15-3.09 | 0.66-0.64 | — |
| TiCNO-3 | 70 | 62.1-61.5 | 31.1-30.8 | — | — | 3.7-4.6 | 3.11-3.08 | — | — |
| Oxidation | 55 | 53.8 | 30 | — | — | 12.5 | — | — | 3.7 |

On top of the bonding layer an α-$Al_2O_3$ layer was deposited. All the α-$Al_2O_3$ layers were deposited at 1000° C. and 55 mbar in two steps. The first step using 1.2 vol-% $AlCl_3$, 4.7 vol-% $CO_2$, 1.8 vol-% HCl and balance $H_2$ giving about 0.1 μm α-$Al_2O_3$ and a second step as disclosed below giving a total α-$Al_2O_3$ layer thickness of about 5 μm. It is only the second α-$Al_2O_3$ step that differs between the coatings E13, E29, E30 and E35, see Table 3.

In samples E13C-1, E13C-2 and E13S the second step of the α-$Al_2O_3$ layer was deposited using 1.2% $AlCl_3$, 4.7% $CO_2$, 2.9% HCl, 0.58% $H_2S$ and balance $H_2$.

In sample E29C-1, E29C-2 and E29S the second step of the α-$Al_2O_3$ layer was deposited using 1.2% $AlCl_3$, 4.7% $CO_2$, 2.8% HCl, 0.35% $H_2S$ and balance $H_2$.

In sample E30C-1, E30C-2 and E30S the second step of the α-Al$_2$O$_3$ layer was deposited using 2.3% AlCl$_3$, 4.5% CO$_2$, 2.8% HCl, 0.34% H$_2$S and balance H$_2$.

In sample E35C-1, E35C-2 and E35S the second step of the α-Al$_2$O$_3$ layer was deposited using 2.2% AlCl$_3$, 4.5% CO$_2$, 4.2% HCl, 0.34% H$_2$S and balance H$_2$.

TABLE 3

(Second α-Al$_2$O$_3$ deposition step)

Second α-Al$_2$O$_3$ deposition step (balance H$_2$):

| | HCl [vol %] | CO$_2$ [vol %] | H$_2$S [vol %] | AlCl$_3$ [vol %] |
|---|---|---|---|---|
| E13 | 2.9 | 4.7 | 0.58 | 1.2 |
| E29 | 2.8 | 4.7 | 0.35 | 1.2 |
| E30 | 2.8 | 4.5 | 0.34 | 2.3 |
| E35 | 4.2 | 4.5 | 0.34 | 2.2 |

Example 2

References

Cemented carbide substrates of ISO-type CNMG120408 for turning were manufactured from 7.2 wt-% Co, 2.7 wt % Ta, 1.8 wt % Ti, 0.4 wt % Nb, 0.1 wt % N and balance WC, comprising a Co enriched surface zone of about 25 μm from the substrate surface and to a depth into the body being essentially free from cubic carbides.

Inserts were first coated with a thin approximately 0.4 μm TiN-layer then with an approximately 8 μm TiCN layer by employing the well-known MTCVD technique using TiCl$_4$, CH$_3$CN, N$_2$, HCl and H$_2$ at 885° C. The volume ratio of TiCl$_4$/CH$_3$CN of the MTCVD deposition of the TiCN layer was 2.2 for the coating R10. For the coating R25 the volume ratio of TiCl$_4$/CH$_3$CN in an initial part of the MTCVD deposition of the TiCN layer was 3.7, followed by a period using a ratio of TiCl$_4$/CH$_3$CN of 2.2.

On top of the MTCVD TiCN layer was a 1-2 μm thick bonding layer deposited at 1000° C. by a process consisting of three separate reaction steps. First a HTCVD TiCN step using TiCl$_4$, CH$_4$, N$_2$, HCl and H$_2$ at 400 mbar, then a second step using TiCl$_4$, CH$_3$CN, CO, N$_2$, HCl and H$_2$ at 70 mbar and finally a third step using TiCl$_4$, CH$_3$CN, CO, N$_2$ and H$_2$ at 70 mbar and thereby producing a bonding layer. Prior to the start of the α-Al$_2$O$_3$ nucleation, the bonding layer was oxidized for 4 minutes in a mixture of CO$_2$, CO, N$_2$ and H$_2$.

Thereafter an α-Al$_2$O$_3$ layer was deposited at 1000° C. (HTCVD) and 55 mbar in two steps. The first step using 1.2 vol-% AlCl$_3$, 4.7 vol-% CO$_2$, 1.8 vol-% HCl and balance H$_2$ giving about 0.1 μm α-Al$_2$O$_3$ and a second step using 1.16% AlCl$_3$, 4.7% CO$_2$, 2.9% HCl, 0.58% H$_2$S and balance H$_2$ giving a total α-Al$_2$O$_3$ layer thickness of about 5 μm.

The R10 and R25 coatings (i.e. the coatings on samples R10C-1, R10C-2, R25C-1, R25C-2) also comprises an outermost layer of about 1 μm thick TiN.

Example 3

Texture Analysis

XRD was used to analyse the TC values of the α-Al$_2$O$_3$ and the TiCN in accordance with the method as disclosed above. Two sample individuals of the coated CNMG120408 substrate were texture analysed and subsequently wear tested, while the coated SNMA120408 substrate was only texture analysed. The layer thicknesses were analysed in a light optical microscope by studying a cross section of each coating at 1000× magnification and both the bonding layer and the initial TiN layer are included in the TiCN layer thickness given in Table 2. The results are presented in Table 4.

TABLE 4

(Thickness and diffraction data)

| Sample | Layer thickness TiCN [μm] | Layer thickness α-Al$_2$O$_3$ [μm] | TC(0 0 12) of α-Al$_2$O$_3$ | I(0 0 12)/ I(0 1 14) of α-Al$_2$O$_3$ | TC(4 2 2) of TiCN | TC(3 1 1) of TiCN | TC(2 2 0) of TiCN |
|---|---|---|---|---|---|---|---|
| E13C-1 | 9.6 | 4.6 | 7.6 | 1.5 | 3.69 | 2.04 | 0.15 |
| E13C-2 | | | 7.7 | 1.7 | 4.08 | 2.07 | 0.10 |
| E13S | | | 7.7 | 3.8 | 5.64 | 1.67 | 0.04 |
| E29C-1 | 9.9 | 5.2 | 7.6 | 1.3 | 4.04 | 2.07 | 0.14 |
| E29C-2 | | | 7.6 | 1.4 | 4.12 | 2.05 | 0.11 |
| E29S | | | 7.6 | 2.0 | 4.73 | 2.06 | 0.10 |
| E30C-1 | 9.3 | 4.3 | 7.6 | 1.7 | 4.21 | 2.02 | 0.14 |
| E30C-2 | | | 7.5 | 1.6 | 4.37 | 2.08 | 0.12 |
| E30S | | | 7.6 | 2.1 | 4.89 | 2.02 | 0.09 |
| E35C-1 | 8.3 | 4.5 | 7.3 | 1.1 | 3.79 | 1.93 | 0.22 |
| E35C-2 | | | 7.3 | 1.2 | 3.87 | 1.97 | 0.20 |
| E35S | | | 7.2 | 1.4 | 4.80 | 1.95 | 0.15 |
| R10C-1 | 7.9 | 5.2 | 6.4 | 0.6 | 1.63 | 1.34 | 1.74 |
| R10C-2 | | | 7.0 | 0.7 | 2.07 | 1.40 | 1.32 |
| R25C-1 | 8.3 | 4.7 | 6.7 | 0.7 | 2.26 | 1.72 | 0.71 |
| R25C-2 | | | 6.9 | 0.8 | 2.30 | 1.64 | 0.83 |

Example 4

Cutting Test

Prior to cutting wear tests, the inserts were blasted on the rake faces in a wet blasting equipment using a slurry of alumina in water and the angle between the rake face of the cutting insert and the direction of the blaster slurry was about 90°. The alumina grits were F220, the pressure of slurry to the gun was 1.8 bar, the pressure of air to the gun was 2.2 bar, the average time for blasting per area unit was 4.4 seconds and the distance from the gun nozzle to the surface of the insert was about 145 mm. The aim of the blasting is to influence the residual stress in the coating and the surface roughness and thereby improve the properties of the inserts in the subsequent turning test.

The coated cutting tools of the ISO type CNMG120408 as blasted were tested in longitudinal turning in ball bearing steel (100CrMo7-3) using the following cutting data;

Cutting speed $v_c$: 220 m/min
Cutting feed, f: 0.3 mm/revolution
Depth of cut, $a_p$: 2 mm
Water miscible metal working fluid was used.
One cutting edge per cutting tool was evaluated.

In analyzing the crater wear, the area of exposed substrate was measured, using a light optical microscope. When the surface area of the exposed substrate exceeded 0 2 mm² the life time of the tool was considered to be reached. The wear of each cutting tool was evaluated after 2 minutes cutting in the light optical microscope. The cutting process was then continued with a measurement after each 2 minutes run, until the tool life criterion was reached. When the size of the crater area exceeded 0 2 mm² the time until the tool life criterion was met was estimated based on an assumed constant wear rate between the two last measurements. Beside crater wear, flank wear was also observed, but did not in this test influence the tool life. Two parallel tests were run for each type of coating, for example sample E13C-1 was tested in wear test 1 and the samples E13C-2 was tested in wear test 2. The samples with SNMA120408 geometry were not evaluated in any cutting test. The results are shown in Table 5.

TABLE 5

(Wear performance)

| Coating | Crater wear test 1 [min] | Crater wear test 2 [min] |
|---------|--------------------------|--------------------------|
| E13     | 51.3                     | 55.6                     |
| E29     | 41.3                     | 46                       |
| E30     | 40.7                     | 46                       |
| E35     | 35.3                     | 31.3                     |
| R10     | 24.5                     | 29.6                     |
| R25     | 27.2                     | 28                       |

While the invention has been described in connection with various exemplary embodiments, it is to be understood that the invention is not to be limited to the disclosed exemplary embodiments; on the contrary, it is intended to cover various modifications and equivalent arrangements within the appended claims.

The invention claimed is:

1. A coated cutting tool comprising a substrate coated with a coating comprising a layer of $\alpha$-$Al_2O_3$, wherein said $\alpha$-$Al_2O_3$ layer exhibits a texture coefficient TC(hkl), as measured by X-ray diffraction using CuK$\alpha$ radiation and $\theta$-2$\theta$ scan, defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

wherein I(hkl) is the measured intensity (integrated area) of the (hkl) reflection,
$I_0$(hkl) is the standard intensity according to ICDD's PDF-card No. 00-010-0173, n is the number of reflections used in the calculation, and where the (hkl) reflections used are (1 0 4), (1 1 0), (1 1 3), (024), (1 1 6), (2 1 4), (3 0 0) and (0 0 12);
TC(0 0 12) is ≥7.6;
the ratio of I(0 0 12)/I(0 1 14) is ≥1; and
wherein the coating further comprises an MTCVD TiCN layer located between the substrate and the $\alpha$-$Al_2O_3$ layer, the TiCN layer being located between the $\alpha$-$Al_2O_3$ layer and the substrate exhibits a texture coefficient TC(hkl), as measured by X-ray diffraction using CuK$\alpha$ radiation and $\theta$-2$\theta$ scan, defined according to Harris formula where I(hkl) is the measured intensity (integrated area) of the (hkl) reflection, $I_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1),TC(2 2 0) being ≤0.2.

2. The coated cutting tool according to claim 1, wherein the thickness of the $\alpha$-$Al_2O_3$ layer is 2-20 μm.

3. The coated cutting tool according to claim 1, wherein the thickness of the MTCVD TiCN layer is 4-20 μm.

4. The coated cutting tool according to claim 1, wherein the coating further comprises a bonding layer including an HTCVD deposited TiN, TiCN, TiCNO and/or TiCO or a combination thereof, wherein the HTCVD TiCN and TiCNO are located outermost of the MTCVD TiCN layer and adjacent to the $\alpha$-$Al_2O_3$ layer.

5. The coated cutting tool according to claim 4, wherein the thickness of the bonding layer is 0.5-2 μm.

6. The coated cutting tool according to claim 1, wherein the TiCN layer exhibits a TC(4 2 2)≥3.

7. The coated cutting tool according to claim 1, wherein the TC(3 1 1)+TC(4 2 2) of the TiCN layer is ≥4.

8. The coated cutting tool according to claim 1, wherein the substrate is selected from cemented carbide, cermet, ceramic.

* * * * *